(12) United States Patent
Bühler et al.

(10) Patent No.: US 7,948,758 B2
(45) Date of Patent: May 24, 2011

(54) CIRCUIT BOARD UNIT AND METHOD FOR PRODUCTION THEREOF

(75) Inventors: Ernst Bühler, Losone (CH); Rino D'Amario, Sigirino (CH); Reto Knaak, Ascona (CH)

(73) Assignees: Agie Charmilles SA, Losone (CH); Charmilles Technologies SA, Meyrin 1 (CH)

( * ) Notice: Subject to any disclaimer, the term of this patent is extended or adjusted under 35 U.S.C. 154(b) by 683 days.

(21) Appl. No.: 11/977,725

(22) Filed: Oct. 25, 2007

(65) Prior Publication Data

US 2008/0160246 A1 Jul. 3, 2008

(30) Foreign Application Priority Data

Oct. 27, 2006 (EP) .................................. 06022498

(51) Int. Cl.
*H05K 7/20* (2006.01)
(52) U.S. Cl. ........ 361/702; 361/739; 361/746; 361/701; 361/689; 29/837
(58) Field of Classification Search .................. 361/702, 361/739, 746, 701, 689; 29/837
See application file for complete search history.

(56) References Cited

U.S. PATENT DOCUMENTS

| | | | | |
|---|---|---|---|---|
| 3,952,231 A * | 4/1976 | Davidson et al. | | 361/717 |
| 4,698,729 A * | 10/1987 | Riesner et al. | | 361/716 |
| 4,706,164 A | 11/1987 | L'Henaff et al. | | |
| 4,718,163 A | 1/1988 | Berland et al. | | |
| 4,835,598 A | 5/1989 | Higuchi et al. | | |
| 5,050,037 A * | 9/1991 | Yamamoto et al. | | 361/699 |
| 5,088,005 A * | 2/1992 | Ciaccio | | 361/699 |
| 5,166,775 A * | 11/1992 | Bartilson | | 361/690 |
| 5,305,184 A * | 4/1994 | Andresen et al. | | 361/699 |
| 5,708,566 A * | 1/1998 | Hunninghaus et al. | | 361/704 |
| 6,501,662 B2 * | 12/2002 | Ikeda | | 361/760 |
| 2003/0010485 A1 | 1/2003 | Goldman et al. | | |
| 2004/0252535 A1 * | 12/2004 | Kenny et al. | | 363/144 |
| 2006/0044765 A1 * | 3/2006 | Chen | | 361/720 |

FOREIGN PATENT DOCUMENTS

| | | |
|---|---|---|
| DE | 40 12 100 A1 | 10/1991 |
| DE | 42 40 996 C1 | 6/1994 |
| EP | 0 408 904 A2 | 1/1991 |
| EP | 0 844 808 B1 | 5/1998 |
| WO | WO96/23397 | 8/1996 |

* cited by examiner

*Primary Examiner* — Tuan T Dinh
*Assistant Examiner* — Steven Sawyer
(74) *Attorney, Agent, or Firm* — Harness, Dickey & Pierce, P.L.C.

(57) ABSTRACT

The invention relates to a circuit board unit and a method for production thereof. The circuit board unit comprises a circuit board topmost laminate with conductive tracks on the upper side for mounting surface-mountable devices. The circuit board topmost laminate features a thickness dimensioned such that the anticipated heat dissipated by the surface-mountable devices is transported from the upper side to the underside of the circuit board laminate to good effect. The circuit board unit further comprises an electrically insulating laminate arranged under the circuit board topmost laminate, inserts made of a material with good heat conductivity and electrical insulation embedded in the electrically insulating laminate at sites below surface-mountable devices with high heat dissipation, and a cooling plate arranged below the electrically insulating laminate and the inserts.

17 Claims, 8 Drawing Sheets

CIRCUIT BOARD UNIT AND METHOD FOR PRODUCTION THEREOF

The invention relates to a circuit board unit and a method for production thereof, particularly a circuit board unit for removing the heat dissipated by SMDs in power electronic applications.

BACKGROUND OF THE INVENTION

Power electronic solutions for objects are increasingly in demand, for example, which formerly, when at all, were achieved with mechanical or electromechanical means. The ever-increasing labor and material costs as well as volume and weight of the electronic assemblies pose the main obstacle for innovative solutions. The tasks making for the most costs are usually manually mounting the power semiconductors and their assembly on cooling devices for evacuating the heat dissipated. The reliability of an assembly is currently dictated practically solely by the quality of these manual working procedures, the quality assurance needed for this purpose adding to the costs involved, however.

Producing, testing, operating and maintenance of such electronic assemblies must be successful on an international scale. For this purpose, material and production must be minimized, but also repairs, modifications and lastly an environmentally compatible disposal must be guaranteed. Fabrication needs to be significantly more reliable to reduce the costs of testing.

Furthermore, it is of advantage when same or similar modules can be made use of in high-priced and cheap products.

A totally new challenge has materialized in the construction of machine tools where the electronics cabinets are now required to be replaced by modules which then need to be installed directly. Since machine tools react to dissipated heat by expanding and distorting, conventional air cooling of the modules is no longer acceptable, at least for high-precision machines.

In the case of electrical discharge machining (EDM) the situation is particularly complicated since these systems also include installing generator modules with dissipated heat in the kilowatt range.

PRIOR ART

Modules are available for drive systems and associated fields since a long time. These mostly involve single to three-phase bridge circuits or diode, IGBT or MOSFET chips soldered to a special copper-ceramic substrate and contacted by bond leads. It would be feasible to provide such modules with a water cooled backplane and package it together with the control electronics.

The disadvantage of this solution is that the degree of integration of the modules is much too small to realize more complex circuits and that a partial failure in a module cannot be repaired. Many manual procedures critical to quality such as applying the heat conductive paste or tricky fastener work still remain with this solution. The heat dissipated by the control electronics may also be considerable, this problem likewise not being solved.

Complex power eletronics modules in surface-mounted device (SMD) technology are finding ever-increasing application in the large series production of cars and drive systems, whereby the SMDs are automatically mounted on a single-sided circuit board. The underside of the circuit board is bonded with a metallic backplane for removal of heat dissipation. One such solution is disclosed in EP 0 590 354 B1 and is shown in FIG. 3 as prior art. The module is connected to the cooling system via the backplane, usually involving special, thin, electrically insulating layers with elevated heat conductivity as a better cooling of the power elements.

Although modules of this kind are an improvement, they have the disadvantage that they still fail to adequately cool where elevated dissipation is involved, on the one hand, and, on the other are practically non-repairable because the solid backplane represents such a high heat sink that the soldering temperature of leadless solders can hardly be achieved without ruining the circuit in such repair work. To render the heat-conducting insulation layer effective it is fabricated minimized in thickness which, unfortunately, also results in the disadvantage of high electrical stray capacitances.

One variant of this solution provides for two circuit boards bonded to a core of approximately 1 mm to 5 mm aluminium or copper and which can also be provided with insulated contacts between the two circuit boards. The main disadvantages as cited above still remain, but in addition to this, the components towards the center of the circuit boards receive considerably less cooling, because of the limited lateral heat conductivity of the cooling plate, since the heat can only be removed via the edges of the circuit board.

Disclosed in EP 0 844 808 B1 is a circuit board with directly integrated cooling passageways said to permit manufacture with currently popular methods of circuit board fabrication, U.S. Pat. No. 4,718,163 (shown in FIG. 4) as well as U.S. Pat. No. 4,706,164 and DE 40 12 100 A1 as cited in the European patent show very similar solutions.

It is interesting that despite the innovation potential of these four patents since their application up to 20 years ago, none of them has found any appreciable acceptance in the marketplace. There must be reasons for this: firstly reliably segregating the coolant from the electronics of the circuit board (the laminates of which tend to be slightly hygroscopic) is hardly achievable with the methods as proposed, and secondly the cooling capacity of the disclosed solutions is quite simply inadequate for current power applications.

When integrating control electronics and power electronics in a single module, water absorption by the circuit board laminates is particularly fatal. Water with its relative dielectric constant $\in_R = 80$ results even in small amounts in the stray capacitances being multiplied to disadvantage with catastrophical consequences in view of the currently popular high clock frequencies. On top of this, water absorption elevates conductivites and thus stray currents ruining e.g. high-impedance analog circuits and insulation barriers.

The corrosion of metallic parts and moldy deposits on non-metallic parts of the circuit board are further negative consequences of water absorption. Although alternative coolants are proposed in these patents, the cooling capacity is then even further drastically reduced and problems with environment compatability can materialize.

OBJECT OF THE INVENTION

As compared to prior art the invention is based on the object of defining a circuit board unit and a method for its production which can now assure adequate removal of the heat dissipated by SMDs. Preferably, production, quality assurance, operation and later disposal of the circuit board units are intended to be better in line with environmental requirements.

The invention solves this problem with the subject matter of the independent claims, preferred embodiments of the invention are described in the dependent claims.

Preferred embodiments of the invention will now be detained with reference to the attached drawings in which:

FIGS. 1 and 2 are diagrammatic views of the basic structure of a die sinking electric discharge machine FIG. 3 is a view of a prior art circuit board unit for cooling SMDs disclosed in EP 0 590 354 B1;

FIG. 4 is a view of a prior art circuit board unit for cooling SMDs disclosed in U.S. Pat. No. 4,718,163;

DESCRIPTION OF PREFERRED EMBODIMENTS OF THE INVENTION

The invention can be used in general for electrical/electronic circuits of any kind, its main field of application being, however, in machine and plant engineering, especially precision machine tools. This is why to make for a better understanding of the invention the circuit board units with integrated cooling will now be described in conjunction with one such special application in which the circuit board units are directly installed in machine tools and similar power electronics applications, particularly in electrical discharge machining (EDM), but which is not to be understood restricted thereto. For this purpose the basic configuration of such EDM systems is firstly described.

Figure 2:
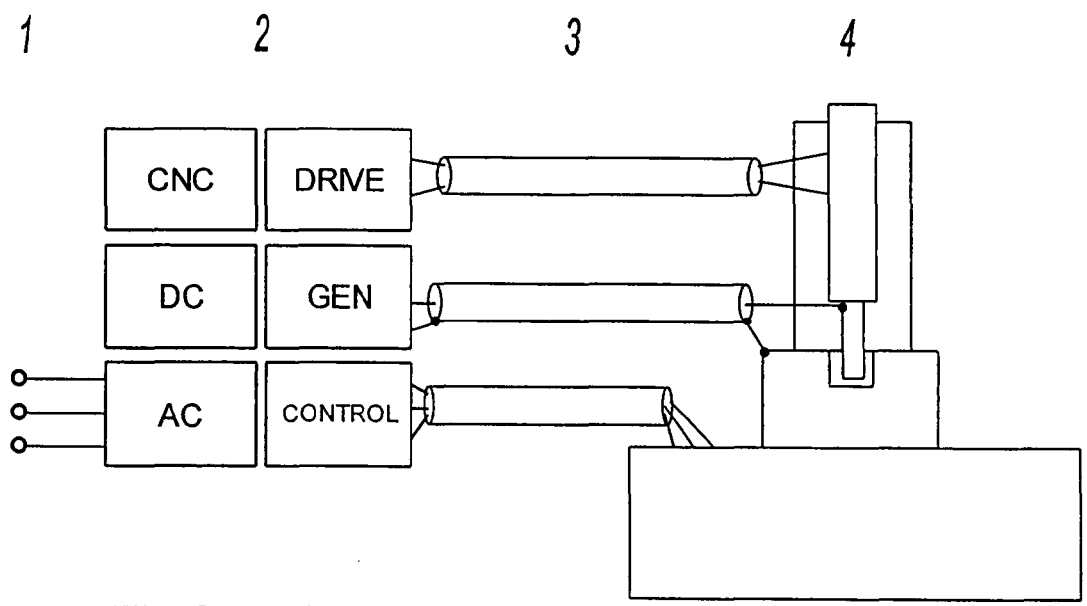

The general configuration of the EDM system as shown diagrammatically in FIG. 2 can be sectioned as follows: power input 1, electronics sector 2, cable assembly 3 and machine sector 4.

The electronics sector 2 e.g. an electronics cabinet contains a power voltage module (AC), a DC voltage module (DC), a numeric control module (CNC), one or more drive modules (DRIVE), a generator module (GEN) as well as a machine controller (CONTROL). Since the full content of the electronics sector 2 may be substantial in volume and weight and total dissipation can also be in kW range, it is normally sited some distance away from the machine 4.

The cable assembly 3 is usually 2 m to 5 m long. A first cable connects the drive modules (DRIVE) to the motors powering the axis drives of the machine 4 and conducts the motor current, the current for any braking required as well as diverse digital sensor signals of the position transducers. These cables constitute a significant cost factor and can easily cause trouble in operation if not designed with all due care.

A second cable connects the generator module (GEN) to the workpiece and to the electrode of the machine 4. This second cable has the disadvantage that the cable losses, particularly in wire cutting, due to the pulse current RMS, can be a high as 100 W/m. Apart from this being a waste of energy this can also result in thermal distortion of the machine structure and thus in workpiece inaccuracies. Currently the only way of solving this problem is complex water cooling of the cables.

Another disadvantage is also the high stiffness of the cables used, typically needing to be configured of eight coaxial cables in parallel, each having a copper cross-section of approximately 2×5 mm$^2$. Since the cables are attached to moving structural parts of the machine, their stiffness also results in elastic deformations of these structural parts in micron range and thus, of course, to corresponding workpiece inaccuracies.

Finally a third cable serves to connect the machine control module (CONTROL) to a wealth of functions on the machine 4, such as e.g. solenoid valves, pumps, auxiliary drives, end switches, temperature sensors, safety means, etc. This third cable likewise adds considerably to the costs, not only because it involving very many different conductors, but also because, ultimately, every variant of the machine requires a special cable. Yet another disadvantage materializes when the machine 4 and electronics cabinet 2 are shipped separately to the customer by the wealth of connections of cable assembly 3 being an added risk of error.

Figure 1:
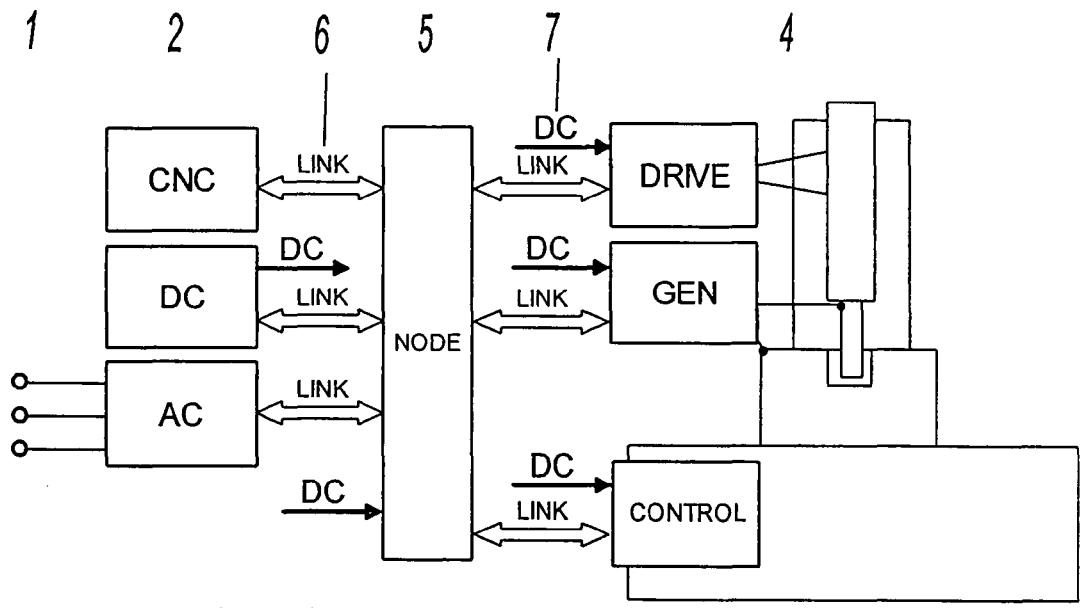

Shown in FIG. 1 are the salient assemblies of a die-sinking electric discharge machine fitted with circuit board modules (simply termed modules in the following or in accordance with their corresponding electrical function also as control module, power module, and the like). This arrangement too can be sectioned according to the function in each case for a better illustration, which in turn are modularized according to: power input 1, electronics sector 2, machine 4, node 5, data connection section 6 and power supply 7. Firstly involved in the arrangement as known is a power input 1 followed by the electronics sector or electronics cabinet 2 comprising a power voltage module (AC), a DC voltage module (DC) and a numerical control module (CNC). In this embodiment the electronics sector 2 comprises fewer elements and may be incorporated e.g. in the operator console. The further elements such as a drive module (DRIVE), a generator module (GEN) and a machine control module (CONTROL) are directly installed in the machine 4, i.e. at their function sites.

In this embodiment links are provided in the data connection section 6 of the system all of which, as in a spoked arrangement, come together in the node 5. The digital connections form a kind of local network or data network interconnecting and intercommunicating the various modules of the system and/or to the node 5. The node 5 in the present embodiment is used to access information or resources to the various modules of the system, such as the configurable generator module (GEN).

It is, of course, necessary that the modules are rendered immune to the harsh environment in the machine involving dirt, water spray and electromagnetic interference, a closed metallized plastics housing, or even better, a full metal housing meeting these requirements.

Figure 5:
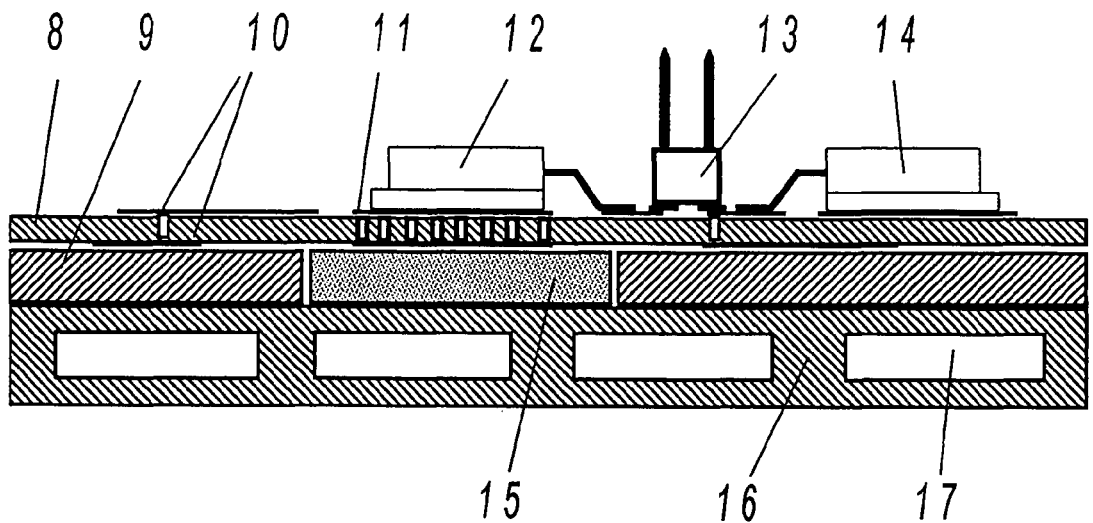
FIG. 5 is a section view of first embodiment of a circuit board unit for power functions in accordance with the invention

Referring now to FIG. 5 there is illustrated a section view through the structure of a circuit board unit for power functions (simply termed power board in the following) with integrated fluid cooling. A "power board" is understood to be an electronic assembly comprising a circuit board with solder-mounted SMD power semiconductors, such as diodes, MOSFETs and IGBT, but also passive SMD power elements such as capacitors, inductances, transformers, resistors or sensors, actuators and connectors. Of course, passive components too, profit from the fluid cooling in enabling them to be selected smaller and thus making for added compactness.

The currents involved are typically 5 A to 200 A and the voltages typically 50V to 1200V. It will be understood that even advanced semiconductors and passive elements feature are less than 100% efficient so that considerable power losses materialize. A power module with an input rated at e.g. 3.5 kW and an efficiency of 86% results in a power loss of 490 W. To handle the high currents, conductor tracks even more than 0.2 mm thick are in use nowadays.

To evacuate such high power losses the topmost laminate 8 of the power board is dimensioned particularly thin and subsequently provided with plated-through holes 11 under SMDs 12 having high dissipated heat. For the conductor tracks 10 two planes suffice in most cases which may be joined by plated-throuogh holes, made possible, for example, thanks to the rigorous segregation of power circuits and control signals by SMD connectors 13 which exit the control signals from the power board in the shortest way possible.

Such thin circuit boards such as the topmost laminate 8, 0.1 mm to 1 mm thick, would be unsuitable for industrial soldering processes for their lack of stability, also missing being an electrical insulation from the cooling plate 16. This is why an insulation laminate 9 is provided which as to thickness and structure is optimized to the factors; effective cooling, insulating strength and small stray capacitances. This optimization results in laminates 0.2 mm to 2 mm thick depending on requirements.

For SMDs 14 having a low heat dissipation, the lower thermal conductivity of approximately 0.3 W/mK of the laminates is already sufficient for transporting the heat to the cooling plate 16 with the cooling passageways 17. For SMDs 12 having a high heat dissipation, thermally high conductive ceramic inserts 15 the same in thickness as the insulation laminate 9 are embedded there to minimize the temperature difference between SMDs 12 and cooling plate 16. It is possible to set this temperature difference as desired by the plurality of plated-through holes 11 between the solder island of the SMDs 12 and a similar island on the opposite side of the topmost laminate 8. This has the advantage that all SMDs can be maintained at roughly the same temperature in diminishing the thermal stress. The combination of a thin topmost laminate 8 and an insulation laminate 9 with the ceramic inserts 15 results in a lateral elastic structure capable of handling the thermal expansion. Such a power module stands up to temperature cycling longer and thus has longer useful life than known solutions.

Tests have shown that with a system having a topmost laminate 8, 0.8 mm thick, for instance, and aluminium oxide ceramic inserts 15 0.6 mm thick for a SMD package D2PAK a power loss of 40 W and with a SMD package D3PAK even 70 W can be reliably evacuated under real operating conditions. It is to be noted that the corresponding TO220 and TO247 packages for wired components permit not even half of such a performance, this major advancement now making a much more compact design possible.

Making the topmost laminate 8 and aluminium nitride ceramic inserts 15 even thinner would make it possible to handle even higher power losses. However, there are critical limits to how far the SMDs can be loaded, above which the reliability drops in general because of the temperature cycling. In this range, reducing the component temperature by 10° C. can result in useful life being doubled.

The recesses in the insulating laminate 9 for the ceramic inserts 15 can be produced by methods as usual circuit board manufacture or in large series production e.g. also by punching. Inserting the ceramic inserts 15 can, of course, be likewise automated in large series production. As an alternative, just recesses may also be provided in the insulation laminate 9 for insertion of ceramic inserts 15 thinner than the insulation laminate 9.

Particularly well suited as the material for the ceramic inserts 15 is the aforementioned aluminium nitride (AlN) with a thermal conductivity of 180 W/mK, but it may well be that the much cheaper aluminium oxide ($Al_2O_3$) with a thermal conductivity of 27 W/mK is adequately suitable. Likewise suitable is beryllium oxide (BeO) with a thermal conductivity of 260 W/mK but has less preference because of its dust being highly toxic. The dielectric strength with all of these ceramics is in the excellent range of 10 to 20 kV/mm and is more than adequate in meeting the requirements, for example, in EDM. The relative dielectric constant $\in_R$ in the range 6.5 to 8.5 is more deciding as to selecting the thickness of the insulation laminate 9 and of the ceramic inserts 15.

For bonding the laminates 8, 9 and the cooling plate 16 recourse can be made to the well-known processes for multilayer-circuit boards and the processes for producing the aforementioned circuit board modules with metallic backplanes, whereby the laminates 8, 9 and cooling plate 16 are bonded with prepregs, i.e. prepolymerized films as thin as 50 micron are polymerized in a subsequent baking process. Prepregs have a shelf-life of more than 6 months at room temperature. Such prepregs can also be filled with a powder, they then comprising a better thermal conductivity. Suitable are e.g. the products THERMAL CLAD available from the Berguist Co, (www.bergquistcompany.com) or T-LAMINATE and T-PREG available from the company Thermagon (www.thermagon.com). Any gaps and irregularities are totally filled out in polymerisation under pressure and heat, resulting in such a circuit board then featuring adequate stability well suited for all industrial soldering processes.

Figure 6:
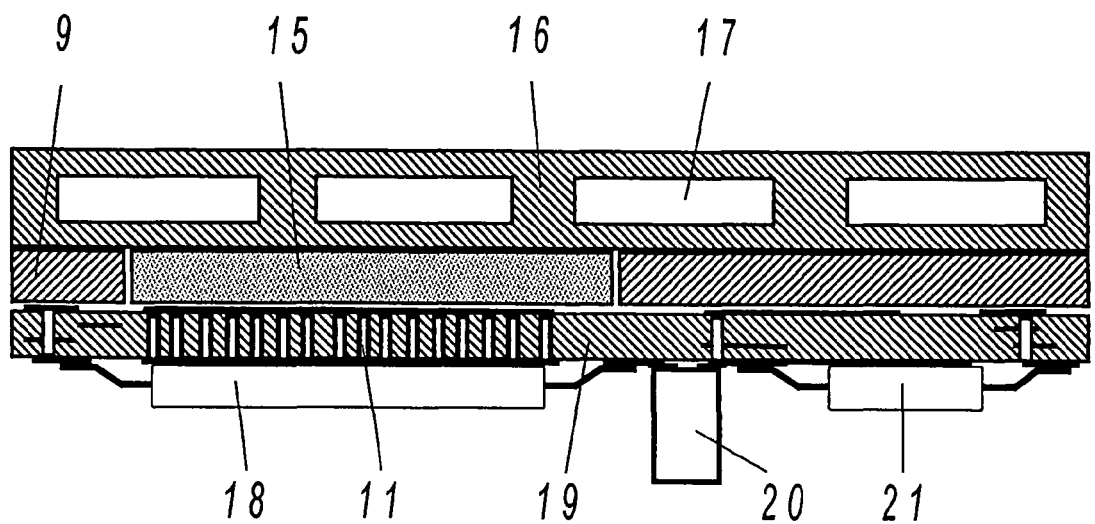
FIG. 6 is a section view of a first embodiment of a circuit board unit for control functions in accordance with the invention

Referring now to FIG. 6 there is illustrated the counterpart to the power board, namely the control board comprising all necessary SMDs 18, 20, 21 etc. for ambient communication and operating the power board. Here, however, the requirements are totally otherwise. For instance, the topmost laminate 19 is required to accommodate mostly highly complex track patterns and although the significant currents and voltages are merely in the milliamp and voltage range the frequencies are in the upper MHz range. But the total power loss of a control board is usually less than 50 W. It may be nevertheless an advantage, e.g. under a processor 18 with high dissipated heat to provide the same measures as for a power board (plated-through holes 11 and/or ceramic inserts 15). Advanced BGA packages comprise leads on the underside making them particularly suitable because of their good thermal contact.

If only SMDs 21 having low heat dissipation are involved one or both of these measures can be omitted to save costs and a usual insulation laminate 9 employed without recesses. The SMD connectors 20 as the counterpart of the SMD Plugs 13 of the power board must, of course, be a perfect match and corresponding precisely positioned.

The cooling plate 16 with the cooling passageways 17 can be selected identical to those of the power board and fabrication is no different otherwise from that of a power board.

Both power and control boards may mount SMD type sensors of a wide variety, in particular voltage and current sensors, temperature sensors, moisture sensors as well as strain and pressure sensors. Sensing e.g. the temperatures at the coolant inlet and outlet and the electrical power at the input and output from the current and voltage permits precise calculation of the effective coolant flow rate e.g. from the difference in temperature and difference in electrical power.

The main task of the various sensors is sensing the values for open and closed loop control, to safeguard and watchdog the modules. Via the already existing LINK connector 23 the sensed values can be communicated to a host controller or polled thereby with the advantage of low-cost assembly at any location of the circuit boards, uncomplicated data communication as well as the existing good contact to the cooling device.

It is also possible to include actuators in the circuit boards, e.g. miniature solenoid valves for open and closed loop control of the coolant flow to enhance maintaining the temperature of the electronics at a constant value. In this arrangement, segregating the coolant from the electronics is maintained since the actuating force is communicated magnetically through the wall of the cooling plate 16. The advantage in this is a significant extension of the useful life of the modules because this permits reducing the number of temperature cycles and thus thermal expansion stress. It is also possible to include SMD actuators, such as relays or miniature electrical drives e.g. for performing switching functions.

Figure 7:
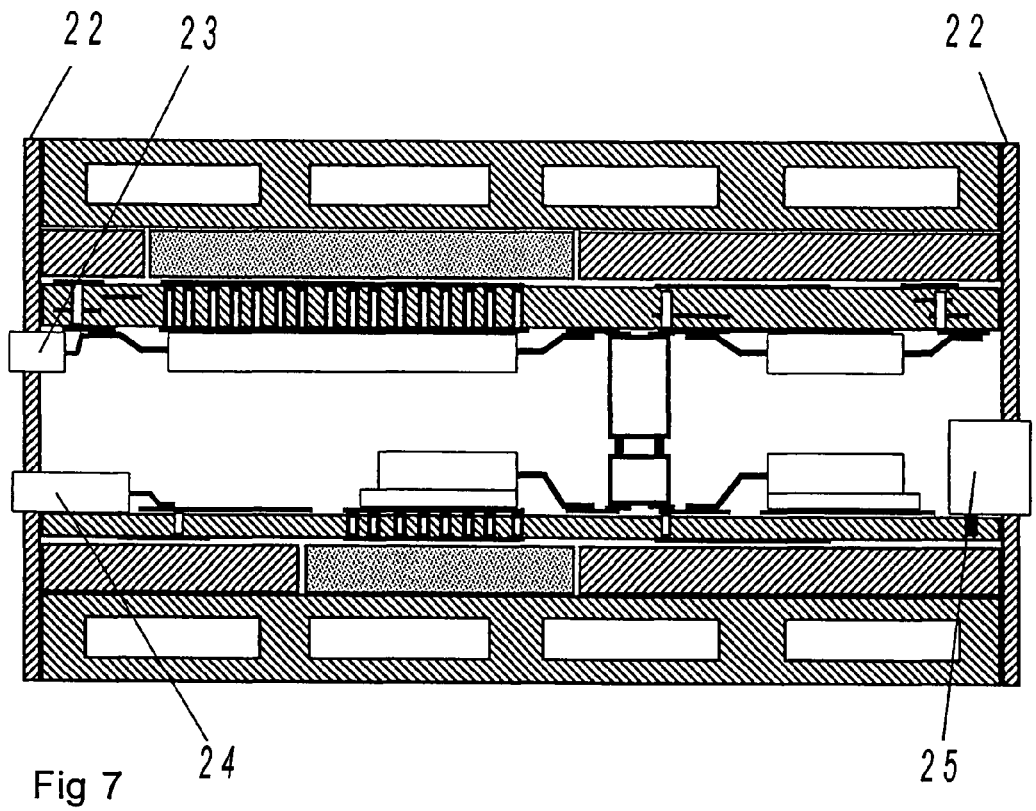
FIG. 7 is a section view of a first embodiment of a circuit board module comprising two circuit board units in accordance with the invention.

Referring now to FIG. 7 there is illustrated the simple combination of a power board and control board in forming a power module. Shown in addition are electrical leads to the outside world. The LINK connector 23 connects the control board to host controllers via standardized interface. The power supply of the control board in this arrangement is preferably transmitted together with the signal flows via this LINK connector 23. A DC connector 24 powers the power board with a high-power DC voltage selected maximized to minimize the cable losses despite the high power.

Because of the usually very high currents the power output 25 of the power board is normally pressfitted, requiring terminals with a plurality of pin contacts to be inserted in a precise arrangement of plated-through holes in the circuit board, the many resulting gas-tight, plastic deformation connections making for very low and durably stable contact resistances.

The advantage of this first embodiment for a power module is a hermetically sealed package simply by adding sidewalls 22 and structural parts 32, 35, 37. The outer surfaces mainly involve cooling plates which effectively prevent heat being dissipated to the environment. Currently popular methods are sufficient for fabricating the circuit boards and their soldering.

Figure 8:
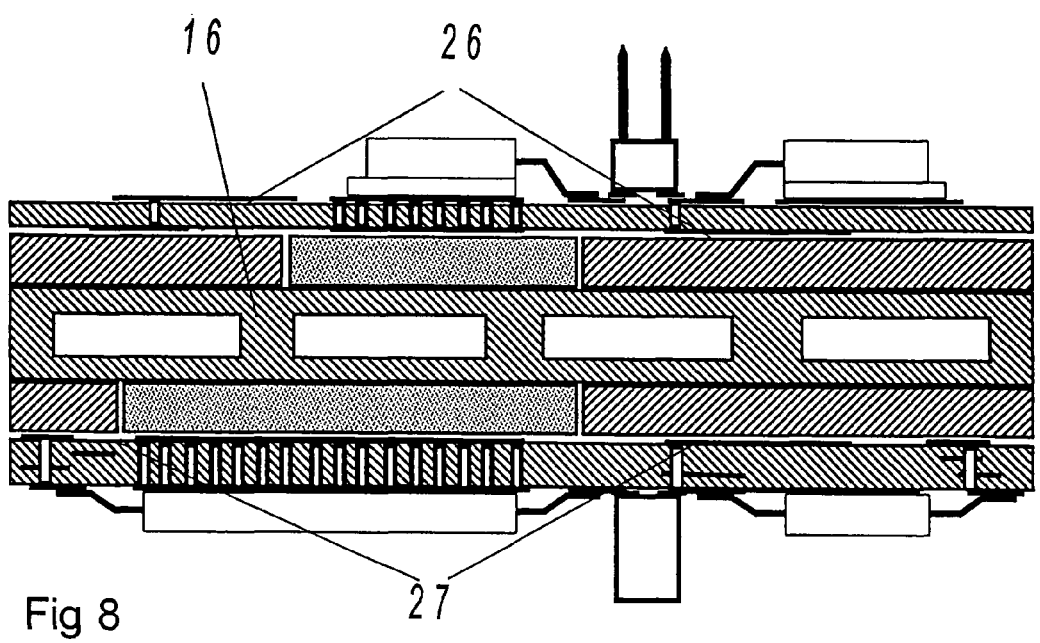
FIG. 8 is a section view of a second embodiment of a circuit board module comprising two circuit board units in accordance with the invention
Figure 9:
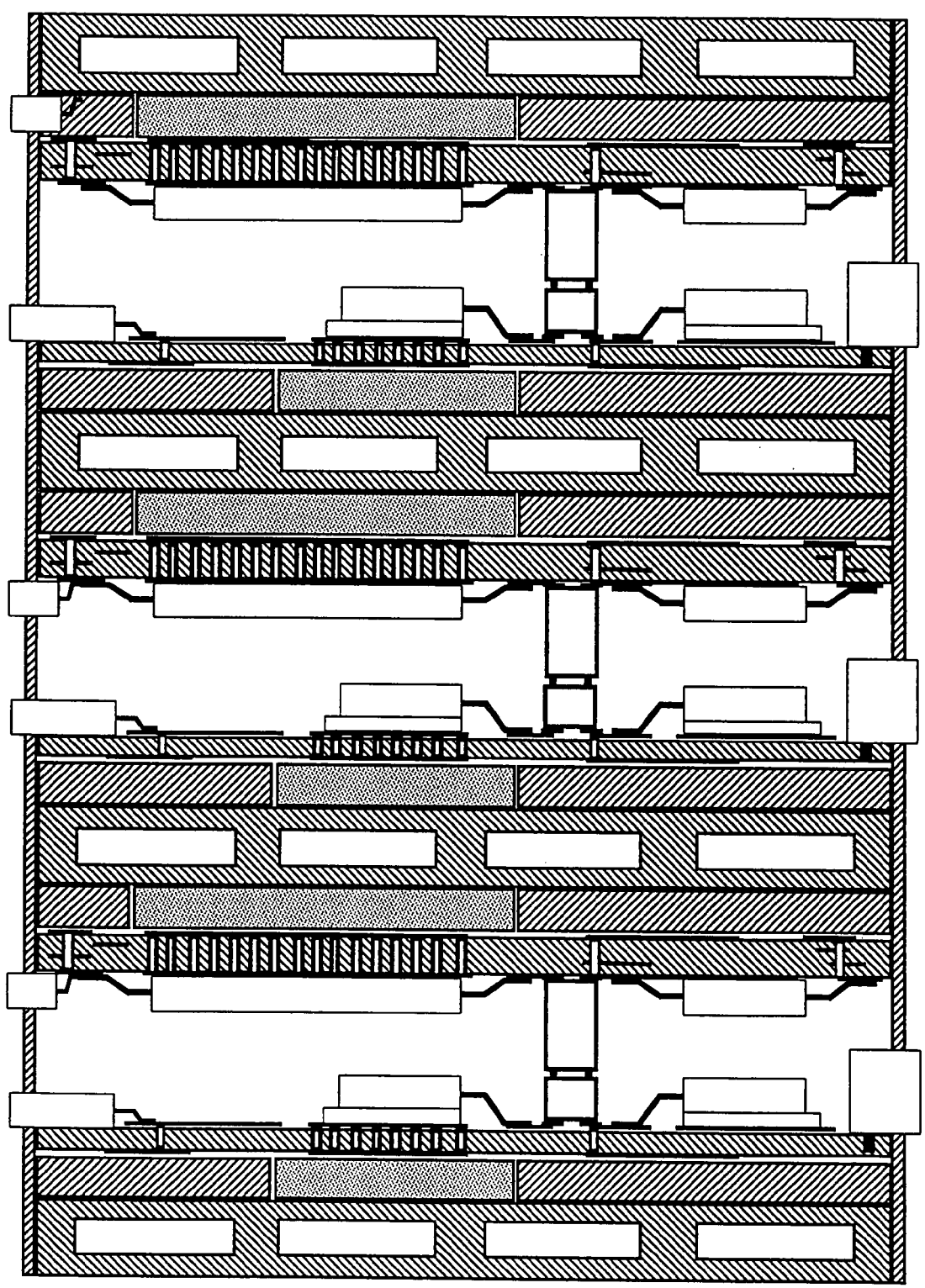
FIG. 9 is a section view of a system pack comprising circuit board modules as shown in FIGS. 7 and 8.

Referring now to FIG. 8 there is illustrated a second embodiment of a power module in which a power board 26 is backed by a control board 27. This arrangement is of advantage when system packs as shown in FIG. 9 are wanted. In this arrangement, firstly a power module is arranged as shown in FIG. 5, then supplemented by any number of modules as shown in FIG. 8, and finally the system pack completed with a control module as shown in FIG. 6.

The configuration as shown in FIG. 8 is somewhat problematic because of it involving a module which needs to be soldered two-sidedly. Although this can be done with current technology, any subsequent repair or modification poses difficulties. This is why two alternatives are now proposed. Either the cooling plate 16 is duplicated, i.e. a power board as shown in FIG. 5 and a control board as shown in FIG. 6 assembled back-to-back into a power module for reseparation at any time, or the control board 27 is releasably connected to the cooling plate 16. Since the power loss of the control board 27 in all tends to be lower it can also be configured with thicker laminates and soldered on an industrial scale without a reinforcing cooling plate 16 or, at most, just with a thin metal plate.

This releasable connection needs to be neither electrically conductive nor insulating, but should have a good thermal conductivity and withstand an operating temperature of up to approximately 100° C. For releasable connections e.g. low-melt solders such as tin-bismuth alloys, e.g. the alloy Sn42/Bi58 with a melting point of 138° C. may be used. Such a connection features a very good thermal conductivity but comes into consideration basically for a connection between copper layers.

Another possibility are special hot-melt bonds which for later repairs can be remelted open. A polyamide-based product AC-2050 available from the company Abifor (www.abifor.com) has a temperature resistance of up to 95° C. and can be worked at roughly 140° C. A similar polyolefine-based product L325 available from the company Wevo (www.wevo-chemie.de) has a temperature resistance of up to 100° C. and a working temperature of 130° C.

An alternative simple possibility are two-sided self-adhesive films filled with ceramic powder specially developed for mounting cooling devices on circuit boards, an example of which is the product THERMATTACH T413 available from the company Chomerics (www.chomerics.com). Although the material has a thermal conductivity of just 0.35 W/mK this is fully sufficient in this case. For instance, a control board with a surface area of e.g. 233 mm times 340 mm could be power loaded up to 155 W for a film thickness of 0.178 mm and a 1° C. difference in temperature to that of the cooling plate 16, which is at least three times better than necessary. When a repair is needed, this adhesive bond can be released with a spatula, but requires a new film when reused.

Figure 12:
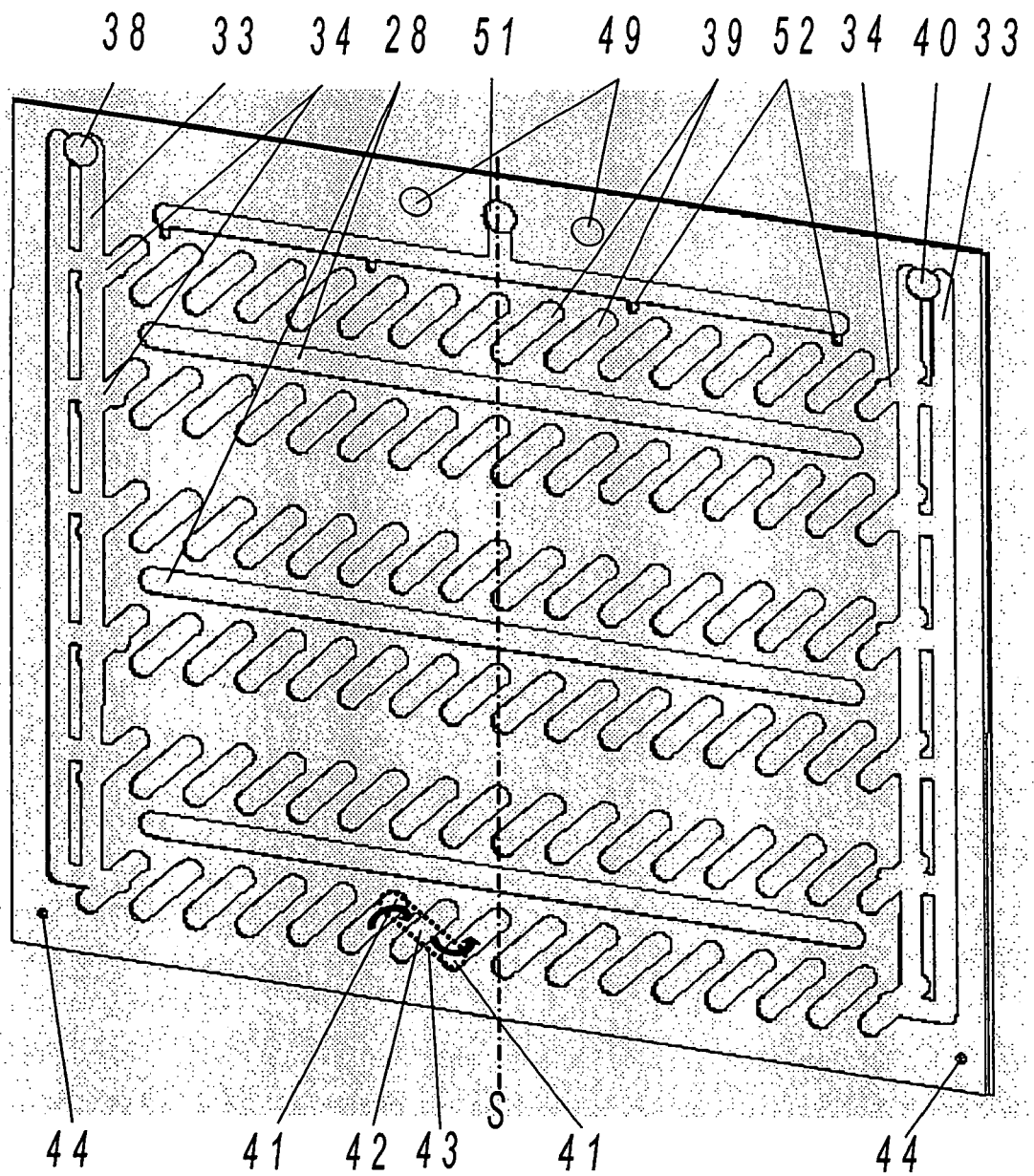
FIG. 12 is a perspective view of one half of a cooling plate with a labyrinth structure to enhance cooling efficiency.
Figure 13:
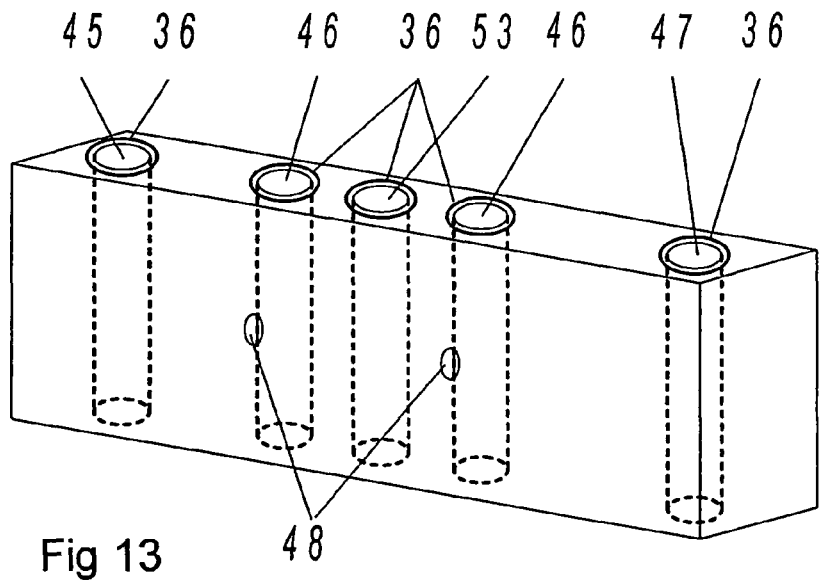
FIG. 13 is a perspective view of a structured part for handling coolant, compressed air and exhaust air.

An even more cost-effective solution is to provide between the cooling plate 16 and the control board 27 an air-permeable layer 50 (see FIG. 11) and to exhaust the combination via ports 52 and 51 in the cooling plate 16 (see FIG. 12) and ports 53 in the structured part as shown in FIG. 13. The space for the air-permeable layer 50 is then at air pressure. The chamber in which the control board 27 is located is subject to a slight overpressure resulting in the control board 27 being urged against the cooling plate 16. The control board 27 having for example a surface area of more than 790 $cm^2$ would experience for a differential pressure of just 10 mbar resulting in a contact pressure of 79N. This is already sufficient to bring the control board 27 via the air-permeable layer 50 into good thermal contact with the cooling plate 16 whilst allowing the control board 27 to be released from the cooling plate 16 whenever required.

For good cooling the layer 50 must not only be air permeable but also in addition feature good thermal conductivity. Possible materials for this purpose are fine wire meshes, structured polymer films such as e.g. the product THERMA-A-GAP T274-ribbed available from the company CHOMERICS (www.chomerics.com), fabrics of the most diverse materials, or also simply nothing. There are, of course, many other solutions and means, such as e.g. microchanneling the cooling plate 16 or rendering the reverse side of the control board 27 uneven, or to connect this zone directly via a hole in the sidewalls 22 to ambient air pressure or even to generate a vacuum in this zone.

When the air-permeable layer 50 has a sufficiently high thermal conductivity the method can also be applied to the power board 26. When using a high-mass cooling plate 16 it is of particular advantage for soldering and repair if the power board 26 also comprises a releasable connection to the cooling plate 16. In other words it is generally the case that a difference in air pressure is required to achieve a contact pressure for better heat transfer.

Exhausting the air via connectors 35, 36 has the major advantage that the modules remain hermetically sealed. Although added costs materialize for an additional tube connection, the air can then be discharged (and where necessary supplied) in a protected zone, otherwise any fluctuation in air pressure would result in moisture or dust gaining access to the module. A vacuum within a module is less preferred for the same reasons, since even the slightest leakage in the package would instantly result in soiled ambient air and moisture entering the package. By contrast just a slightly modified module can be operated with no problem even submersed in water or dielectrics for EDM in which case the releasable connections of the module inputs and outputs would be replaced by cable entries with glands.

An application which is most extreme is e.g. use of the modules in robotic manipulators for obtaining material samples submersed down to a depth of 10 m in nuclear plant reactor cooling water. Such sampling is of vital importance in assessing the operating safety of nuclear power plants, since enormous amounts of money are at risk if a nuclear power station needs to be shut down prematurely, or belatedly in a disaster. As currently achieved, the erosion pulses need to be supplied over 60 m long coaxial power cables at detriment to pulse quality and efficiency. The modules or system pack would be put to use preferably at an elevated air pressure. For this application an air pressure slightly above the water pressure would be selected and automatically adapted to the water depth. In addition it would be necessary, because of the radiation level, to maintain the operating voltages of the power boards more or less low and to use special radiation-tolerant components and materials. Vital functions would be additionally held on standby redundantly, because in this case there is no possibility of repair, the robotic manipulator being namely classified after first-time use as radioactive debris.

Referring now to FIG. 9 there is illustrated a system pack which for a better understanding is depicted exaggeratedly thick. A 3.5 kW pulse generator module would be typically roughly 350 mm long, roughly 250 mm wide and roughly 40 mm thick. Thus a system pack of 10.5 kW would be just approximately 120 mm thick with a volume of 10.5 dm$^3$, resulting in a specific power density of 1 kW/dm$^3$. Although this is not particularly high, it needs to be remembered that what is involved is a complex system in all and that more than half the volume is taken up by control boards and the cooling system.

The embodiment described hitherto may suffer one problem. If, for instance, the power board 26 radiates very strong electromagnetic interference, the control board 27 may be excessively exposed if sited in the immediate vicinity. One possibility of counteracting this is to insert an additional shield plate between the two boards.

Figure 10:
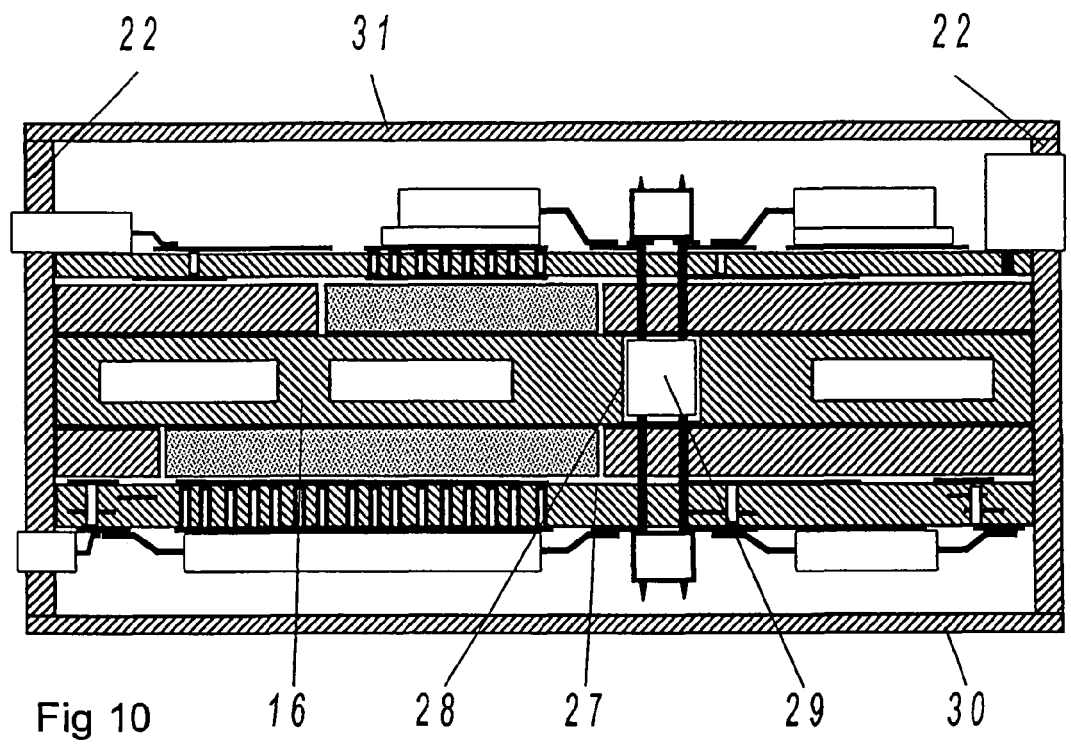
FIG. 10 is a section view of a third embodiment of a circuit board module comprising two circuit board units in accordance with the invention.

Referring now to FIG. 10, there is illustrated an even more effective solution. This third embodiment of a module comprises recesses 28 in the cooling plate 16 for interfacing connectors 29. The cooling plate 16 which is preferably made of aluminium or copper is an excellent shield against both electrical and high-frequency magnetic interference. Depending on the SMD profile the connections between the control board 27 and the power board 26 tend to be somewhat shorter.

The problem of two-sided componenting is in this case the same as in the second embodiment as shown in FIG. 8 and the solutions thereto are likewise the same as proposed by way of FIG. 8. The modules as shown in FIG. 10 can also be stacked into system packs as described above. But the modules should be preferably stacked so that it is always the case that power boards or control boards directly face each other. This saves providing partitioning and just a backplane 30 and a face plane 31 are sufficient for the closures.

Figure 11:
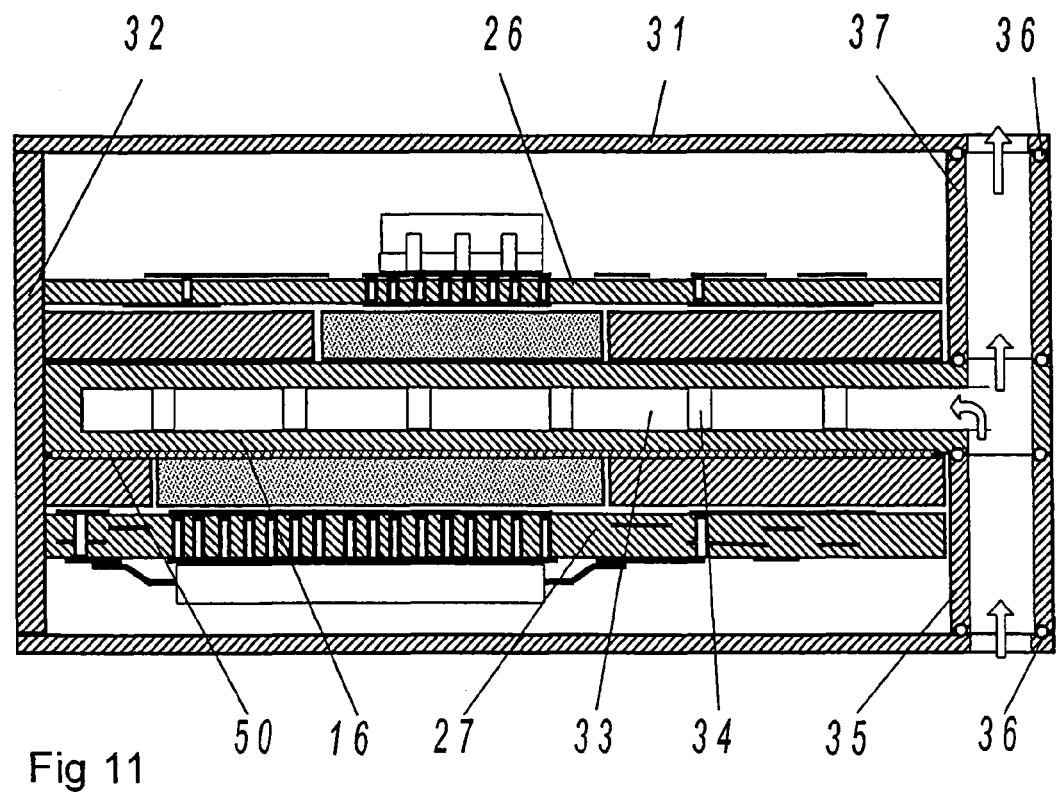
FIG. 11 is a section view of the circuit board modules as shown in FIG. 7 to FIG. 10 to illustrate the coolant flow.

Referring now to FIG. 11 there is illustrated the coolant flow as shown in FIGS. 7 to 10 in the modules, but now in a section view turned through 90°. The right-hand sidewall comprises structured parts made e.g. of aluminium and a lower coolant connector 35 and an upper coolant connector 37 (see also FIG. 13) to result in the cooling plate 16 being clamped in place. Seals 36 like O-rings, gaskets or sealant paste, e.g. silicone paste need to ensure segregation of the coolant and the electronics. The complete pack is held together by screws or similar fasteners (not shown).

The coolant flow is indicated by arrows. For each cooling plate 16 part of the coolant flow is branched off to flow into a distribution passageway 33 and is directed via several inflow ports 34 preferably over labyrinth structures transversely through the cooling plate 16. In the rear part of the cooling plate 16 the coolant is returned in symmetrical passageways to a coolant return into the coolant connectors 35, 37. With modules the upper coolant connector 37 comprises just the ports for compressed air to thus close off the cooling system. Stacked system packs may also feature at the top a coolant connector to enhance the flow.

Instead of the sidewall 32 shown on the left the coolant return could be arranged there. But this would involve the disadvantage that the coolant exists on both sides of the module. Since fluids normally flow from top to bottom, the module will be installed to advantage so that all fluid connectors and seals are at the bottom.

The coolant connectors 35, 37 can be provided with an additional compressed air passage for directing the compressed air into the chambers in which the power modules 26 and control modules 27 are accommodated. This arrangement prevents, on the one hand, any access of fluid or dust even if the package is not a perfect seal, whilst permitting, on the other, as proposed, creating a contact pressure urging the control board 27 against the cooling plate 16 for cooling. Although in this arrangement the pressure may exceed ambient pressure only negligably, the air used must, of course, be as dry and clean as possible. There is also a possibility of monitoring the air consumption as an indication for system leakage, it being obvious that depending on the internal pressure of the modules the package structures 16, 22, 30, 31, 32, 35, 37 need to be engineered corresponding pressure-resistant.

Referring now to FIG. 12 there is illustrated an embodiment of the cooling plate 16, only half of which is shown, i.e. joining two such identical halves results in a cooling plate 16 with a labyrinth structure suitable for a module as shown in FIG. 10. The structures milled in, for example, 1.5 mm thick sheet aluminium are arranged symmetrical to the vertical axis of symmetry S, it being irrelevant in which direction the coolant flows through the cooling plate 16 afterwards, or also in what position relative to the axis of symmetry S a module is later installed in a system pack.

Ported on the upperside are a through passing coolant inlet 38 and for reasons of symmetry two through passing compressed air passages 49 and a through passing coolant outlet 40. The through passing outlet 51 for exhausting the air is connected via distribution passageways to likewise through holes 52 for air exhaust. Centering holes 44 may also be provided through passing to precisely align the two cooling plate halfs, and later the laminates. The through passing recesses 28 for the interfacing plugs 29 are necessary only for the third embodiment of the module as shown in FIG. 10 and are omitted for all other embodiments.

The distribution passageways 33 and the inflow ports 34 to the labyrinth are preferably configured equal in depth to that of the slanting pockets 39.

Machining a cooling plate half takes just a few minutes on a high-speed milling machine which makes for good economy in small series, whereas for large series production preference is given to punching with a more extensive distribution in e.g. four layers, or to flow-pressing, the structures then being impressed at high pressure. Known further a casting and die-casting methods in which the structures are formed with high precision but in taking due account of shrinkage. This method is suitable for processing e.g. zink, aluminium or copper and alloys thereof.

Subsequently, the halves or layers can be bonded with a special adhesive (bonded radiators being popular in car making). But where the requirements are more demanding the halves will more likely to be joined by soft soldering or inert gas or vacuum brazing. The most durable, but most expensive variant would be a weld which would offer the advantage that the cooling plate 16 then consists exclusively of one type of metal and thus less likely to corrode than solder joints. Other jointing methods such as self-adhesive seals, flanging or crimping would be likewise feasible.

To form the labyrinth, slanting pockets 39 down to a remaining wall thickness of roughly 0.5 mm are machined which together with the other half form a static mixer. For a better understanding of the illustration a pocket 43 of the other half is shown dotted. Evident are the overflow points 41 at which the coolant flows from a pocket on one side into the pocket of other cooling plate half and mixes due to the turbulence at the sharp edges with a pocket 43 inbetween at which the partial flows of the two cooling plate halves collide transversely to make for an even more intensive mix. This labyrinth structure prevents laminar flow conditions in the cooling zone in thus substantially enhancing the cooling capacity and it is surprising how low the coolant flow can now be to dissipate the aforementioned high power losses.

One desirable effect lies in the increased flow resistance, thanks to which the flow of the coolant is distributed in the parallel labyrinth structures and as a result of the increase in pressure tends to reduce cavitation effects. On the other side, the increased flow resistance is less desirable because a higher pump pressure requires a higher power. This is why the labyrinth structure by its plurality of pockets 39 is to be carefully dimensioned and inclined with the object of optimizing cooling capacity, flow distribution, pump pressure and preventing cavitation.

In certain cases using water as the coolant of preference requires mixing with additives, such as anti-freeze (e.g. glycol), corrosion inhibitors as well as agents active against algae or microbes. Although such additives may slightly diminish the cooling capacity, they permit reliable operation under adverse working conditions.

The embodiment discussed hitherto is, of course, just one of many different embodiments. It is, for instance, just as possible to use commercially available, thin cooling plates with inserted tubing of non-corrosive stainless steel or also extruded cooling plates. However, the embodiment as proposed above has the special advantage that the cooling plate 16 has no large-area, thin-walled zones and nevertheless features a very low mass, this making it well suitable for the processes of laminate bonding, soldering and later repairs or modifications of the electronics.

The sidewalls 22 of the modules may be made of metal or metal/plastics structures and configured to satisfy the following functions:
  hermetic seal keeping out dirt and moisture,
  preventing electromagnetic radiation,
  preventing heat dissipation,
  porting the module inputs and outputs,
  distribution of coolant,
  distribution of compressed air, and
  return of exhaust air.

Referring now to FIG. 13 there is illustrated a structured part in accordance with the invention for porting coolant, compressed air and exhaust air. The lower coolant connector 37 and the upper coolant connector 37 in FIG. 11 comprise such structured parts, where necessary also engineered differently in height. The parts are preferably made of aluminium or similar metal or alloy, but it is just as possible that they may be made of plastics material or a plastics/metal composite.

Full length drillings are provided for the coolant feed 47, coolant return 45, two for compressed air 46 and one for exhaust air 53. Seals 36 are provided top and bottom in each case (the bottom one not shown). In addition further drillings (not shown) are provided for receiving a vertical union and for securing the sidewalls 22. Some seals 36 could alternative also be a component of the cooling plate 16. The small transverse drillings 48 connect the corresponding compressed air drillings 46 and serve to branch off the compressed air into all chambers of the power and control modules.

Figure 3:
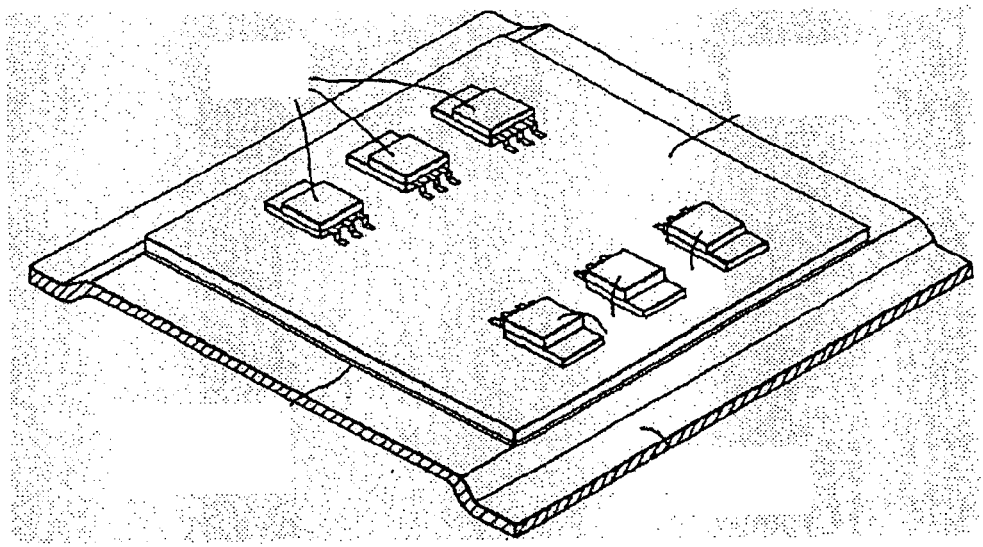
Figure 4:
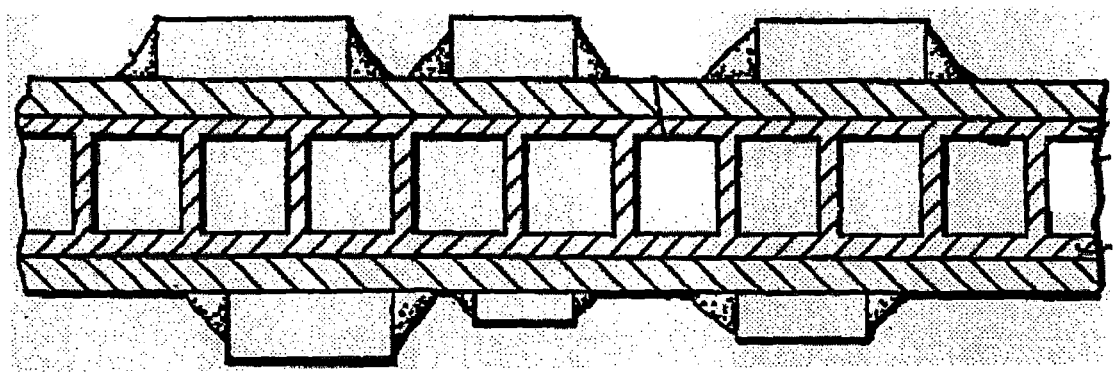
Figure 14:
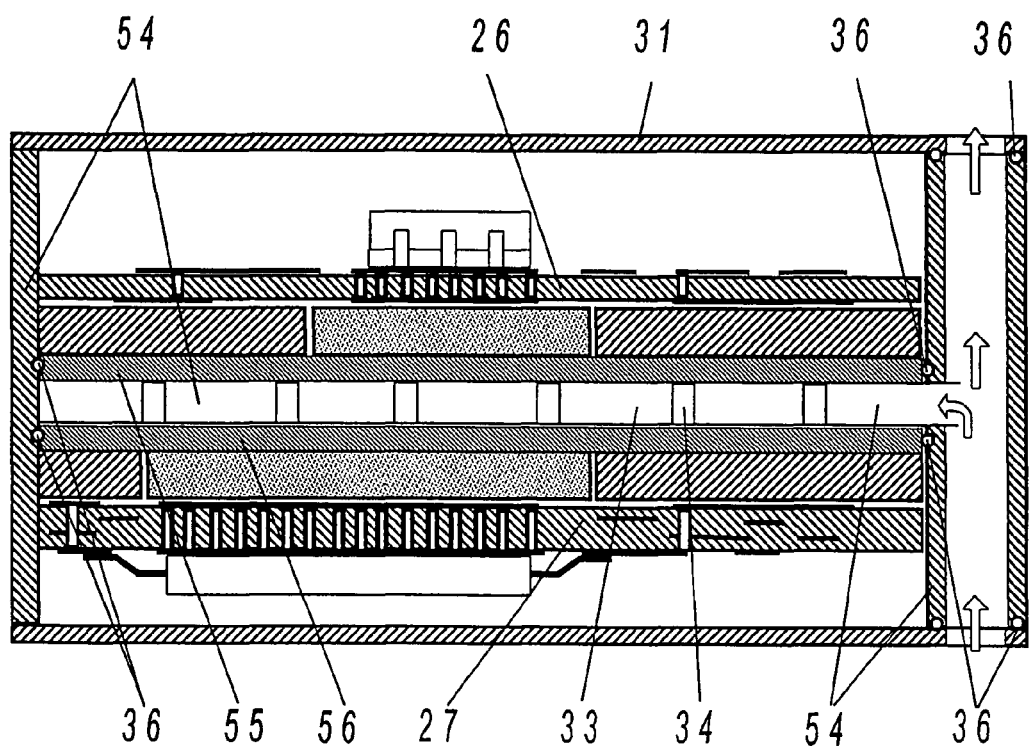
FIG. 14 is a section view of a fourth embodiment of a circuit board module comprising two circuit board units in accordance with the invention and a molding for configuring the labyrinth and package walls.

Referring now to FIG. 14 there is illustrated a fourth embodiment for a module which is specially suitable for large series production. The power board 26 and the control board 27 in this case are each fixedly connected to a metal plate 55, 56 of aluminium, copper or some other metal or alloy having good heat conductivity and good resistance to corrosion. For fabricating these circuit boards 26, 27 the same methods can be put to use as known for the aforementioned modules with backplanes as shown in FIG. 3. Here, however, in favor of facilitated repair as specified the metal plate 55, 56 will be selected just thick enough to safely withstand corrosion over the intended lifetime whilst endowing the circuit boards 26, 27 sufficient structural integrity.

Releasably inserted between the circuit boards 26, 27 is a molding 54 constituting a labyrinth structure as described with reference to FIG. 12, whereby the metal plate 55, 56 comes into contact directly with the coolant flow. Thus, in this case the function of the cooling plate is taken care of by the three parts: metal plates 55, 56 and molding 54. In addition, with the molding 54 also the four sidewalls of the module can be configured including the drillings 45 to 47 as shown in FIG. 13 for porting coolant and air. The molding 54 may be made of a plastics material, a metallized plastics material or of a metal or metal alloy. Heat conductivity is of no importance whatsoever with the molding 54. The molding 54 is likewise provided with seals 36 or similar means to reliably segregate the circuit boards 26, 27 from the coolant.

Otherwise, the possibilities of configuring and applying this fourth embodiment are the same as described for the embodiments already described. One advantage special to this embodiment is the good thermal contact to the coolant flow without any special ancillaries being needed whilst permitting facilitated disassembly of the individual circuit boards 26, 27.

In summary, thanks to the high degree of integration possible and the highly efficient heat removal that the circuit board units and the circuit board modules or system packs composed thereof, are now miniaturised to such an extent that they can be optimally located, particularly in the EDM systems. Thus, for instance, the pulsing performance of the EDM generator is now significantly improved by the high-frequency cables being eliminated. The power modules can now be built hermetically sealed at no major extra expense to thus be compatible with even the harshest environment. On top of this, heat dissipation and electromagnetic radiation of the modules is now minimized, which is of great advantage for direct location in the EDM system. Furthermore, the modules or system packs can now be sited directly where their function is required, with the advantage, for example, that the electrical outputs of the power module are now connected to a consumer in the shortest way possible. Any flexible tubing as needed for the supply and removal of compressed air, exhaust air, coolant can now be routed together with the electrical cables (e.g. the electrical inputs of the power module) over any distance as needed to a dry, clean area of the system or plant.

One important advantage then results from pairing a control board and a power board, because the circuit boards can now vary as to the number of track layers and/or thickness. This firstly results in a new degree of freedom in better optimizing the circuit boards to the application, and secondly, drive and control signals can now be routed between control board and power board correctly sited over the shortest distance via connectors thanks to this principle. Since any number of such pairs can be combined with each other system packs are now also possible for very high power.

This novel principle now makes it possible to use advanced automated methods of mass producing the modules, resulting in an appreciable reduction in costs whilst enhancing repeatability in fabrication quality. Producing, testing, operating and maintenance of the modules can now be done on an international scale. SMT fabrication is based on automatic componenting of unwired SMDs on circuit boards no longer requiring to be drilled to mount the devices and thus feature a plain rear which is excellently suited for cooling purposes.

This also results in yet a further advantage once the product has become useless. Now, namely, for separating electronic and mechanical hardware the circuit board simply requires to be heated to melt the solder and all electronic components can be simply wiped off. Further heating then permits separating the laminates from the more valuable cooling plate and ceramic inserts for refurbishing and reuse. Yet another advantage with these modules is that the coolant is segregated from the electronics absolutely reliably.

A direct fluid cooling now permits to advantage a high degree of integration and high flexibility in siting the power modules.

For determining the thickness of the topmost laminate 8 and of the insulation laminate 9 as well as the configuration of the cooling plate 16 the following factors can be taken into account:

To achieve a high degree of integration the circuit board must comprise at least two track planes, the limiting factor for the number thereof being deterioration of the heat conductivity due to the increase in the thickness of the circuit board.

The shorter the distance between source and sink of the heat the more effective the cooling, the limiting factors in this case being an increase in stray capacitances and reduction in the electrical insulation resistance.

The better the material heat conductivity between source and heat sink the more effective the cooling, the limiting factor being only the costs involved.

The maximum permissible power loss of an SMD can be limited by the temperature of the circuit board or by the temperature of the SMD barrier layer, the thermal resistance of the device in the first case being very good, in the second case tending to be poor as compared to the thermal resistance of the circuit board.

The lower the mass of the cooling plate in direct contact with the circuit board the simpler the latter is to solder, repair and modify, the limiting factor here being in safe segregation of coolant and electronics over the useful life of a module together with adequate mechanical stability.

Water because of its high specific heat, simply heat transport over long distances and its basic environmental compatability is the coolant of first choice with the limiting factors temperatures below freezing or above evaporation, added risk of corrosion as well as susceptibility to algae or microbes.

Through mixing of the coolant in the heat exchanger zones adds to the cooling efficiency since water has a relatively low heat conductivity, the limiting factors being an increase in the flow resistance which requires a higher pressure at the inflow side of the cooling plate. If the flow rate is excessive cavitation may result because of localized vacuum and likewise cause corrosion.

Condensate due to humidity can results in dew forming which likewise causes the circuit boards to absorb water. The limiting factors in this case are the temperature of the circuit board which is required not to be below that of the air, and, of course, the relative humidity and volume of air having access to the circuit boards in all.

The invention claimed is:

1. A circuit board unit comprising:
a circuit board topmost laminate with conductive tracks on the upper side for mounting surface-mountable devices in a thickness dimensioned such that an estimated heat dissipated by the surface-mountable devices is transported from the upper side to the underside of the circuit board topmost laminate;
an electrically insulating laminate arranged under the circuit board topmost laminate;
inserts made of a material with good heat conductivity and electrical insulation embedded in the electrically insulating laminate at sites below surface-mountable devices with high heat dissipated;
a cooling plate arranged below the electrically insulating laminate and the inserts, the cooling plate having a plurality of cooling passageways for circulating a liquid coolant through the cooling plate; and
one or more plated through holes defined in the circuit board topmost laminate for transporting the high heat dissipated from the upper side to the underside of the topmost laminate, the one or more plated through holes located below surface-mountable devices with high heat dissipation, said plated through holes being adapted in number and design to an estimated heat dissipated of each surface-mountable device.

2. The circuit board unit as set forth in claim 1, wherein the circuit board topmost laminate is produced from a glass-fiber epoxy resin material or from a powder-filled polymer.

3. The circuit board unit as set forth in claim 1, wherein the electrically insulating laminate is produced from a glass-fiber epoxy resin material or from a powder-filled polymer, and wherein the inserts are produced from a ceramic having high thermal conductivity and high electrical insulation, particularly aluminum nitride (AlN) or aluminum oxide ($Al_2O_3$).

4. The circuit board unit as set forth in claim 1, wherein the cooling plate is made from one of aluminum, an aluminum alloy, copper and a copper alloy.

5. The circuit board unit as set forth in claim 1, wherein the cooling plate is composed of two structured semi-boards.

6. The circuit board unit as set forth in claim 1, wherein the cooling plate is composed of four punched board layers.

7. A circuit board module comprising:
two circuit board units, each including a circuit board topmost laminate with conductive tracks on the upper side for mounting surface-mountable devices in a thickness dimensioned such that heat dissipated by the surface-mountable devices is transported from the upper side to an underside of the circuit board topmost laminate;
an electrically insulating laminate arranged under the circuit board topmost laminate;
inserts made of a material with good heat conductivity and electrical insulation embedded in the electrically insulating laminate at sites below the surface-mountable devices with high heat dissipated;
a cooling plate arranged below the electrically insulating laminate and the inserts, the cooling plate having a plurality of cooling passageways for circulating a liquid coolant through the cooling plate; and
one or more plated through holes defined in the topmost laminate for transporting the heat from the upper side to the underside of the topmost laminate, the one or more plated through holes located below the surface-mountable devices with the high heat dissipation, the one or more plated through holes being adapted in number to the heat dissipated from each of the surface-mountable devices;
wherein the two circuit board units and additional sidewalls form the circuit board module, the circuit board units are directly electrically interconnected by surface-mountable device connectors and the electrical inputs and outputs are ported through the sidewalls by hermetically sealed electrical connections.

8. The circuit board module as set forth in claim 7, wherein two circuit board units share a cooling plate and the cooling plate comprises recesses for mounting surface-mountable device connectors which directly interconnect the two circuit boards arranged on both sides of the cooling plate.

9. The circuit board module as set forth in claim 7, wherein the circuit board units with the component side are arranged facing each other.

10. The circuit board module as set forth in claim 7, wherein the cooling plate is composed of two semi-boards comprising passageways and through holes for distributing a coolant, and wherein the semi-boards further comprise additional passageways and through holes for exhausting air and for communicating compressed air.

11. The circuit board module as set forth in claim 7, wherein one circuit board unit is designed for control functions and the other circuit board unit for power functions.

12. The circuit board module as set forth in claim 7, which comprises voltage, current, temperature, moisture, strain and/or pressure sensors and actuators for controlling the coolant flow as well as a controller for open and closed loop control, monitoring and protection of the circuit board units.

13. The circuit board module as set forth in claim 7, wherein each cooling plate of the two circuit board units is configured as a metal plate and fixedly connected to each electrically insulating laminate and interconnected via an interposed molding, wherein the molding likewise forms the sidewalls, the coolant ports and/or air ports and wherein the molding is configured so that it comprises in the heat exchanger zones a labyrinth structure for the coolant flow.

14. A system pack including at least two circuit board modules as set forth in claim 7, wherein the at least two circuit board modules are stacked to form a system pack.

15. The circuit board module as set forth in claim 11, wherein the circuit board unit for control functions and/or for power functions is releasably connected to the cooling plate, and the releasably connection is composed of at least one of the following:
a soft-solder joint of a solder alloy with a low melting point;
a hot-melt bond;
a two-sided self-adhesive film; and
an air-permeable, heat conducting layer between circuit board and cooling plate, this layer being subjected to a lower air pressure than that of the remaining interior space of the circuit board module in all, and wherein the air-permeable and heat conducting layer is connected by a first tubular connection, in a dry and clean environment, to atmospheric or low pressure and all of the remaining interior space of the circuit board module is supplied by a second tubular connection with dry and clean air at an elevated air pressure.

16. The circuit board module as set forth in claim 12, wherein the controller is configured such that the flow of air supplied to the circuit board unit is monitored, from which information is derived for diagnostic, warning and protection functions as to the condition of the hermetic seal of the circuit board module.

17. The circuit board module as set forth in claim 13, wherein the molding is made of one of a plastics material, a metallized plastics material, a metal and a metal alloy.

* * * * *